(12) United States Patent
Sumi

(10) Patent No.: US 8,109,605 B2
(45) Date of Patent: Feb. 7, 2012

(54) IMAGE RECORDING APPARATUS AND IMAGE RECORDING METHOD

(75) Inventor: Katsuto Sumi, Minami-ashigara (JP)

(73) Assignee: Fujifilm Corporation, Tokyo (JP)

( * ) Notice: Subject to any disclaimer, the term of this patent is extended or adjusted under 35 U.S.C. 154(b) by 1219 days.

(21) Appl. No.: 11/815,618

(22) PCT Filed: Feb. 2, 2006

(86) PCT No.: PCT/JP2006/302203
§ 371 (c)(1),
(2), (4) Date: Aug. 6, 2007

(87) PCT Pub. No.: WO2006/083004
PCT Pub. Date: Aug. 10, 2006

(65) Prior Publication Data
US 2009/0073505 A1    Mar. 19, 2009

(30) Foreign Application Priority Data
Feb. 4, 2005   (JP) .................................. 2005-029610

(51) Int. Cl.
*B41J 2/15* (2006.01)
(52) U.S. Cl. ................. 347/41; 347/42; 347/19
(58) Field of Classification Search .......... 347/5, 9, 347/14, 15, 19, 41, 42
See application file for complete search history.

(56) References Cited

U.S. PATENT DOCUMENTS

| 6,019,453 | A | 2/2000 | Tsuruoka | |
|---|---|---|---|---|
| 6,533,385 | B1* | 3/2003 | Mackay et al. | 347/19 |
| 6,966,627 | B2* | 11/2005 | Escobedo et al. | 347/41 |

FOREIGN PATENT DOCUMENTS

| EP | 0 991 959 B1 | 4/2000 |
|---|---|---|
| EP | 1 266 763 A1 | 12/2002 |
| EP | 1 500 515 A2 | 1/2005 |
| JP | 2001-500628 A | 1/2001 |
| JP | 2004-184921 A | 7/2004 |
| JP | 2004-258294 A | 9/2004 |
| JP | 2004-303951 A | 10/2004 |

OTHER PUBLICATIONS

Japanese Office Action dated Aug. 10, 2010, corresponding to Japanese Patent Application No. 2006-025427.

* cited by examiner

*Primary Examiner* — Lam S Nguyen
(74) *Attorney, Agent, or Firm* — Sughrue Mion, PLLC

(57) ABSTRACT

The array pitch between image recording element dots, the swath tilt angle, the image recording pitch between image recording dots in a direction y, or the phase difference between image recording positions in the direction y of adjacent image recording dots that are formed in a direction substantially perpendicular to the direction y is adjusted according to an image pattern, so that a jaggy pitch or a jaggy amplitude of jaggies may be of a predetermined value or less to produce a good image.

24 Claims, 18 Drawing Sheets

IMAGE RECORDING APPARATUS AND IMAGE RECORDING METHOD

TECHNICAL FIELD

The present invention relates to an apparatus for and a method of recording an image based on image recording data with an image recording head that is relatively moved in a predetermined scanning direction along an image recording surface.

BACKGROUND ART

There have heretofore been proposed, as an example of image recording apparatus, various exposure apparatus which employ a spatial light modulator such as a digital micromirror device (DMD) or the like for exposing a film to an image represented by a light beam that is modulated depending on image data. The DMD comprises a number of micromirrors disposed in a two-dimensional array on a semiconductor substrate of silicon or the like and having respective reflecting surfaces whose angles are changed depending on a control signal. An exposure head combined with the DMD is relatively moved in a scanning direction along an exposure surface to expose a desired area of the exposure surface to the image represented by the light beam.

Generally, the micromirrors of the DMD are arranged in rows and columns that extend perpendicularly to each other. The DMD may be inclined to the scanning direction to keep scanning lines closely spaced for higher resolution.

For example, Japanese Laid-Open Patent Publication No. 2001-500628 (PCT Application) discloses an illuminating system for guiding light to an auxiliary area (spatial light modulator) having a plurality of light valves, the auxiliary area being inclined to the projection onto scanning lines for increased resolution. The disclosed illuminating system increases the resolution in a direction perpendicular to the scanning direction. The resolution in the scanning direction is normally determined by the scanning speed and the modulating speed of the spatial light modulator, and can be increased by lowering the scanning speed or increasing the modulating speed of the spatial light modulator.

DISCLOSURE OF INVENTION

When an image is recorded with the inclined spatial light modulator for higher resolution, jaggies which cannot be ignored tend to be produced depending on the pattern of the recorded image. For example, when a linear image pattern is recorded in the direction perpendicular to the scanning direction, a misalignment between the positions of dots recorded by the spatial light modulator and the desired position of the image pattern which is recorded may be visually perceived as jaggies.

It is a general object of the present invention to provide an apparatus for and a method of recording a desired image with reduced jaggies without the need for lowering the image recording speed.

A major object of the present invention is to provide an apparatus for and a method of recording a desired image while reducing jaggies due to a plurality of image recording element dots that are arranged discretely.

Another object of the present invention is to provide an apparatus for and a method of recording an image with reduced jaggies by setting optimum image recording conditions without the need for a means for increasing the number of dots recorded per unit area.

BEST MODE FOR CARRYING OUT THE INVENTION

Figure 1:
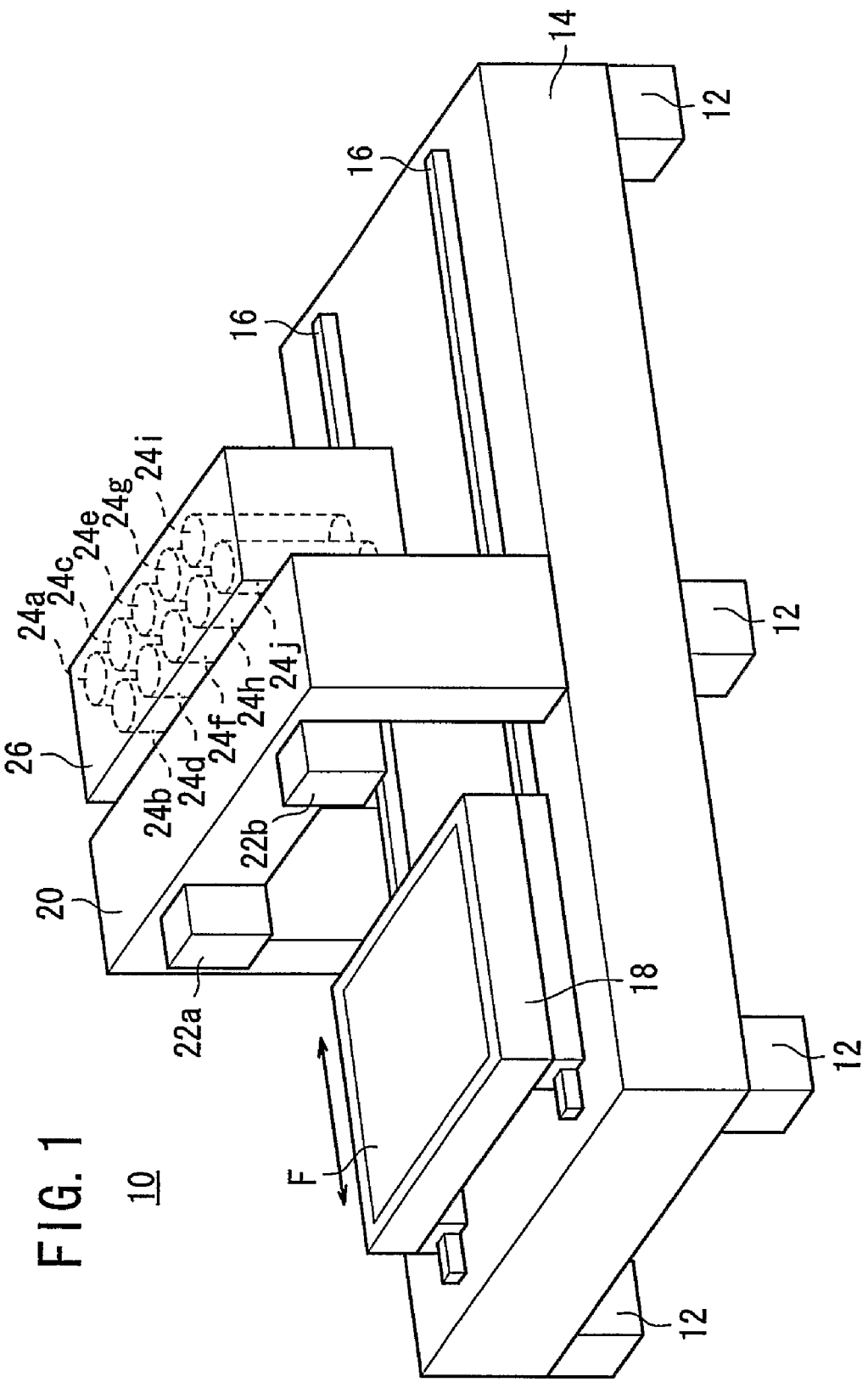
FIG. 1 is a perspective view of an exposure apparatus according to an embodiment of the present invention.

FIG. 1 shows in perspective an exposure apparatus 10 of a flat bed type according to an embodiment of the present invention. As shown in FIG. 1, the exposure apparatus 10 has a base 14 supported by a plurality of legs and an exposure stage 18 is provided on two guide rails 16 mounted on the base 14 for reciprocal movement therealong in the directions indicated by the arrow along. The base 14 is hardly deformed. A board with a sheet film F of a photosensitive material applied thereto is attracted to and, held by the exposure stage 18.

A portal-shaped column 20 is disposed centrally on the base 14 over the guide rails 16. Cameras 22a, 22b are fixedly mounted on one side of the column 20 for detecting an alignment mark formed on the board to which the sheet film F is applied. A plurality of exposure heads 24a through 24j (image recording heads) for recording an image on the sheet film F through exposure are positioned in and held by a scanner 26 that is fixedly mounted on the other side of the column 20.

Figure 2:
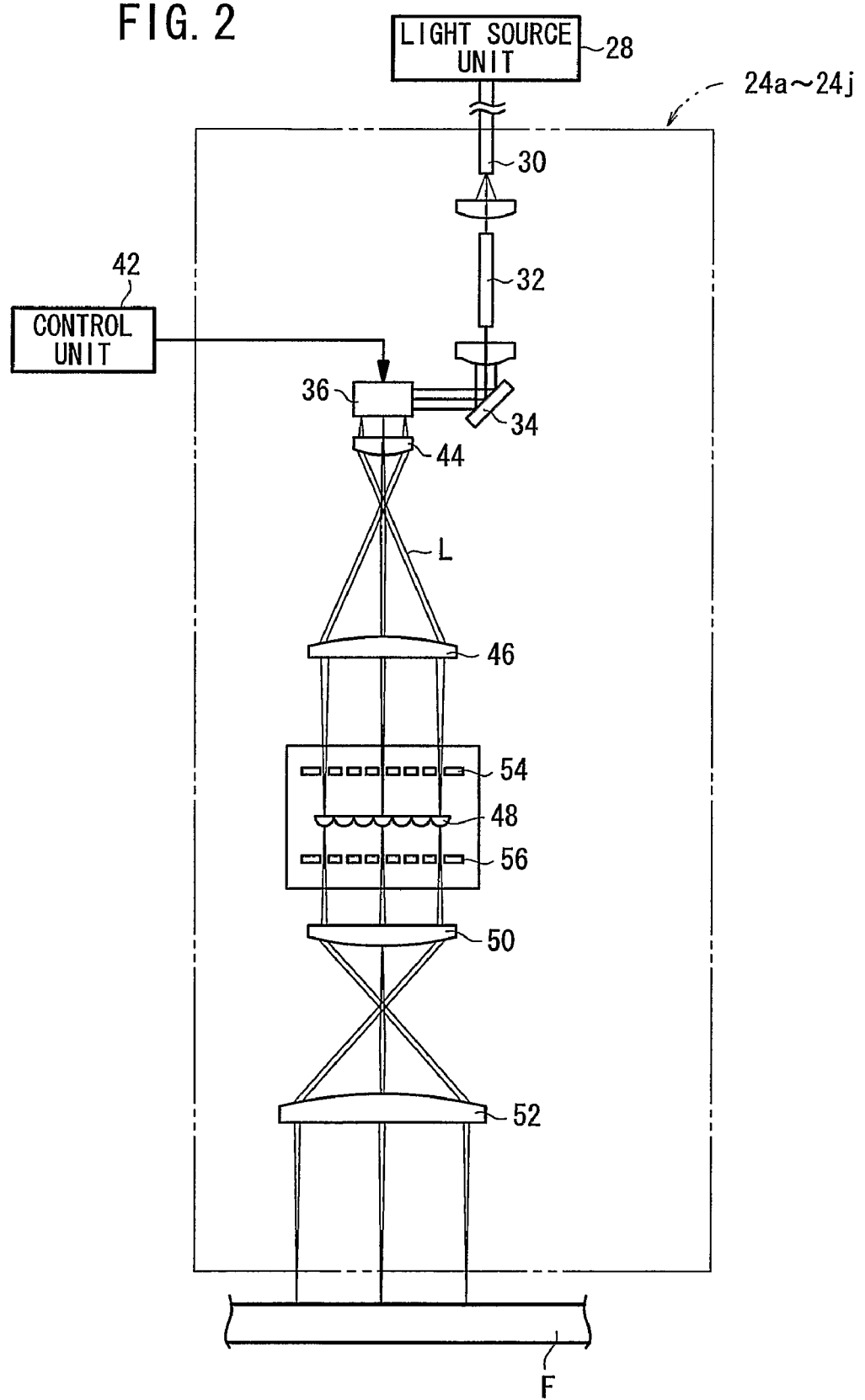
FIG. 2 is a schematic view of an exposure head of the exposure apparatus according to the embodiment.

FIG. 2 shows a structure of each of the exposure heads 24a through 24j. A combined laser beam L emitted from a plurality of semiconductor lasers of a light source unit 28 is introduced through an optical fiber 30 into each of the exposure heads 24a through 24j. A rod lens 32, a reflecting mirror 34, and a digital micromirror device (DMD) 36 are successively arranged on an exit end of the optical fiber 30 into which the laser beam L is introduced.

Figure 3:
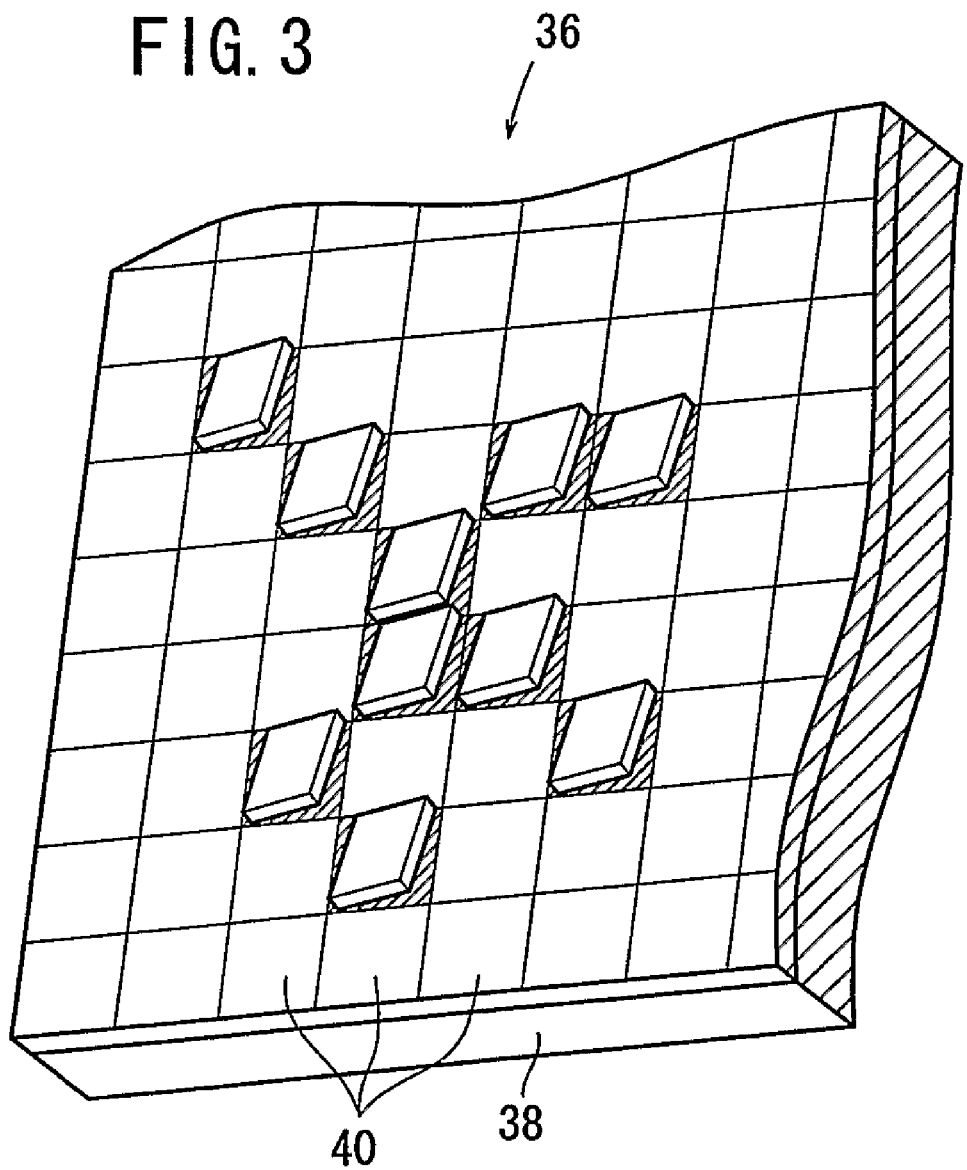
FIG. 3 is an enlarged fragmentary view showing a digital micromirror device (DMD) employed in the exposure head of the exposure apparatus according to the embodiment.
Figure 4:
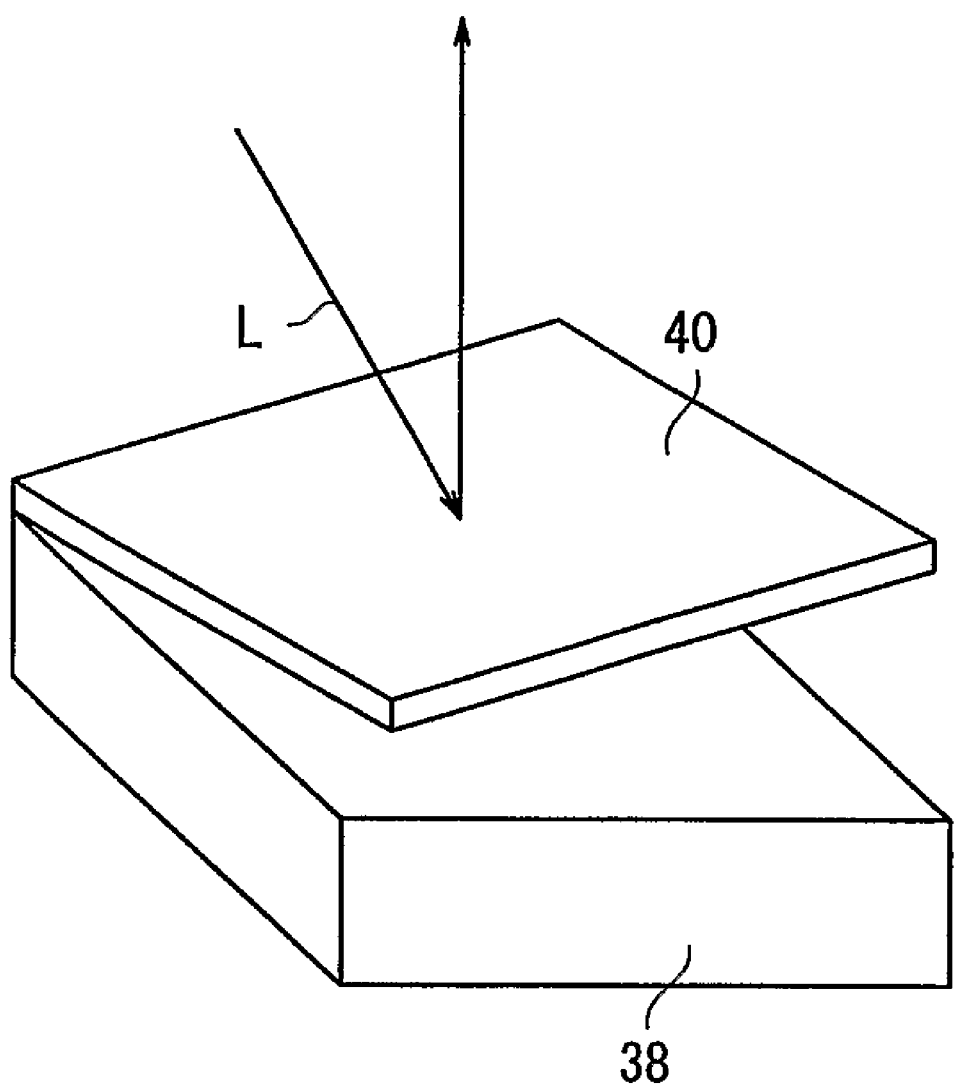
FIG. 4 is a view showing the manner in which a micromirror of the DMD shown in FIG. 3 is set to an on-state.
Figure 5:
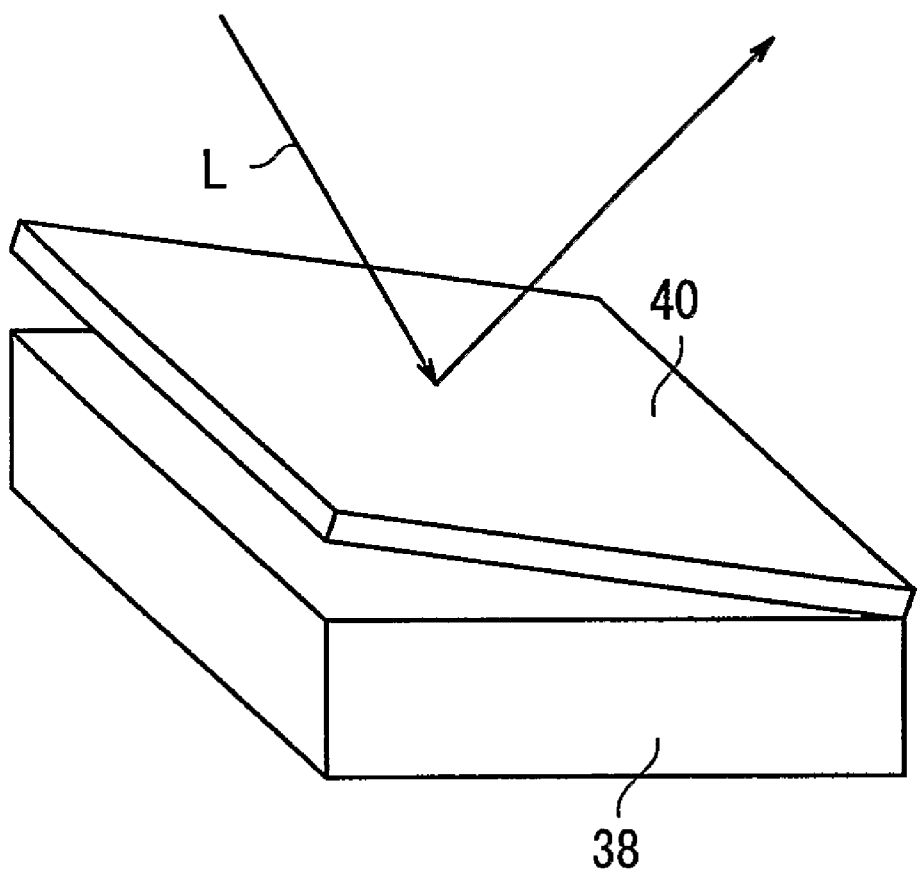
FIG. 5 is a view showing the manner in which the micromirror of the DMD shown in FIG. 3 is set to an off-state.

As shown in FIG. 3, the DMD 36 comprises a number of micromirrors 40 (image recording components) that are swingably disposed in a grid-like pattern on an SRAM cell (memory cell) 38. A material having a high reflectance such as aluminum or the like is evaporated on the surface of each of the micromirrors 40. When a digital signal according to image recording data is written in the SRAM cell 38, the micromirrors 40 are tilted in given directions about a diagonal direction depending on the state of the signal, as, shown in FIGS. 4 and 5. FIG. 4 shows the manner in which the micromirror 40 is tilted into an on-state, and FIG. 5 shows the manner in which the micromirror 40 is tilted into an off-state. Therefore, when the tilt of each of the micromirrors 40 of the DMD 36 is controlled by a modulated signal based on image recording data supplied from a control unit 42, the laser beam L is selectively led to the sheet film F depending on the image recording data, recording a desired image thereon.

In the direction in which the laser beam L reflected by the micromirrors 40 in the on-state is emitted, there are successively disposed first image focusing optical lenses 44, 46 of a magnifying optical system, a microlens array 48 having many lenses corresponding to the respective micromirrors 40 of the DMD 36, and second image focusing optical lenses 50, 52 of a zooming optical system. Microaperture arrays 54, 56 for removing stray light and adjusting the laser beam L to a predetermined diameter are disposed in front of and behind the microlens array 48.

Figure 6:
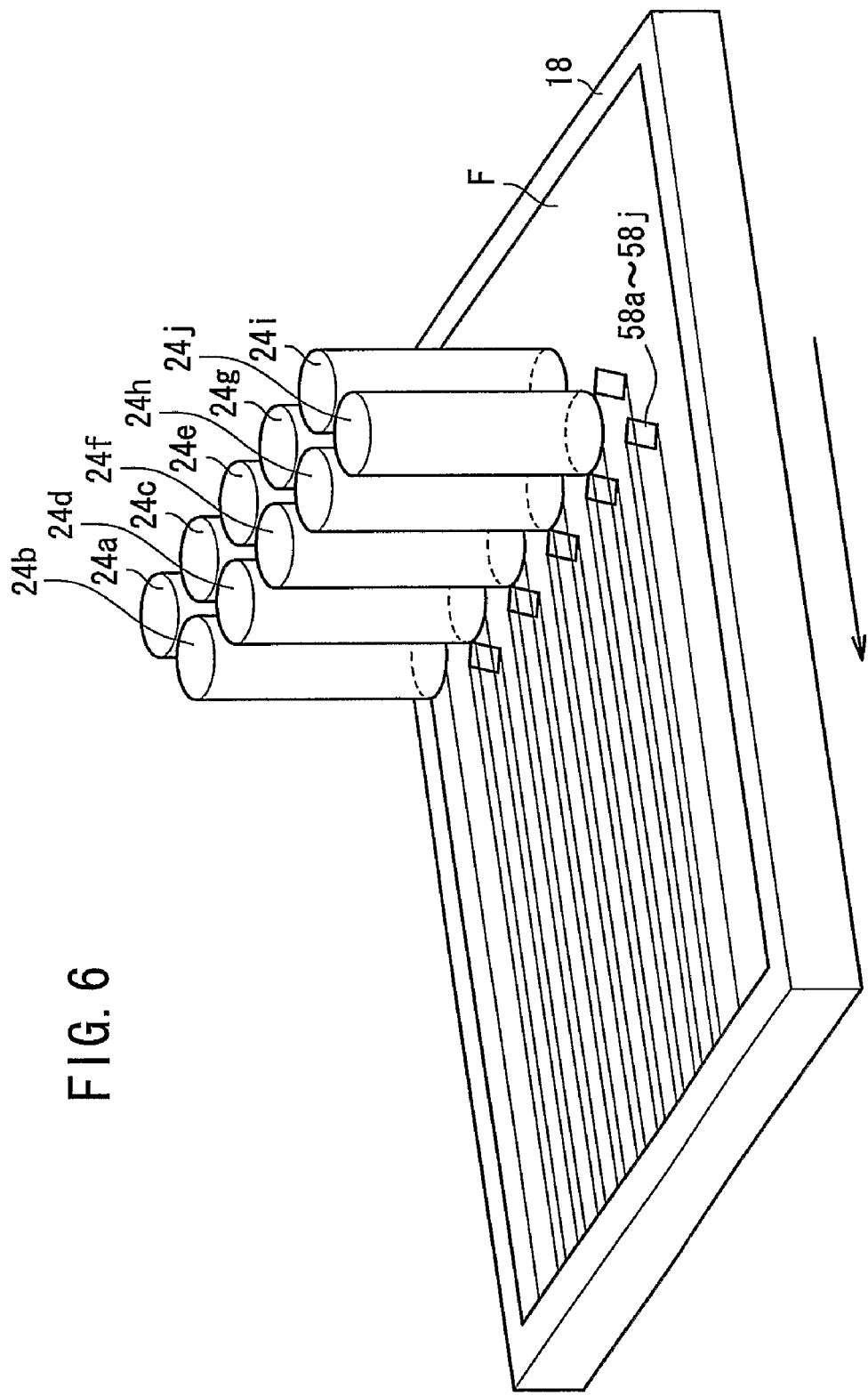
FIG. 6 is a view showing the relationship between the exposure head of the exposure apparatus according to the embodiment and a sheet film positioned on an exposure stage.
Figure 7:
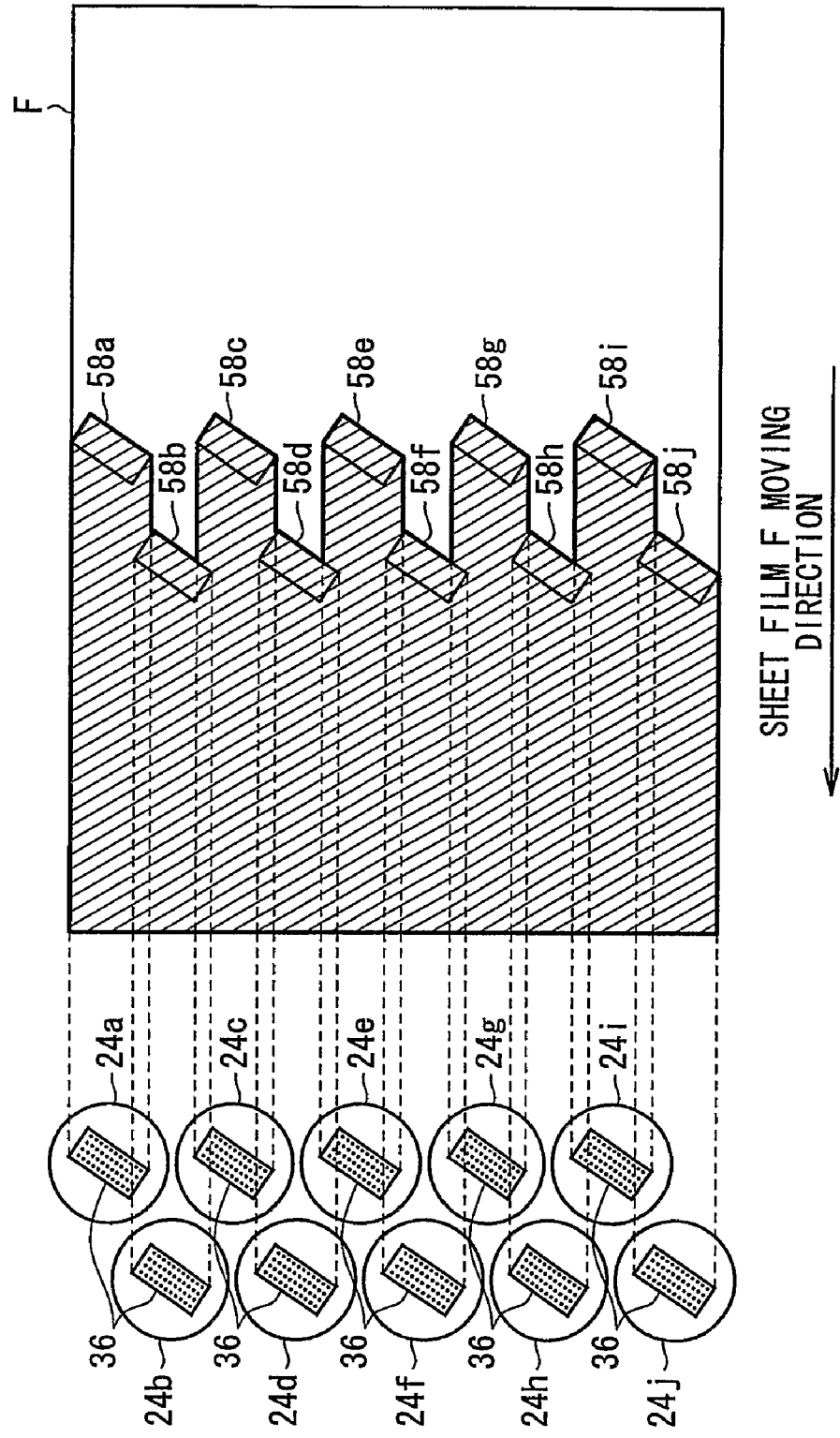
FIG. 7 is a view showing the relationship between the exposure head of the exposure apparatus according to the embodiment and an exposure area on the sheet film.

As shown in FIG. 6, the exposure heads 24a through 24j are arranged in a staggered pattern in two rows extending in a direction perpendicular to the scanning direction of the sheet film F (the moving direction of the exposure stage 18). As shown in FIG. 7, the DMDs 36 incorporated in the respective exposure heads 24a through 24j are inclined a predetermined angle to the scanning direction for achieving higher resolution. Specifically, the DMDs 36 that are inclined to the scanning direction reduce the distance between the micromirrors 40 of the DMDs 36 in the direction perpendicular to the scanning direction, thereby increasing the resolution in the direction perpendicular to the scanning direction. To make the exposure heads 24a through 24j seamless, they are arranged such that exposure areas 58a through 58j produced by the respective exposure heads 24a through 24j overlap in the direction perpendicular to the scanning direction.

Figure 8:
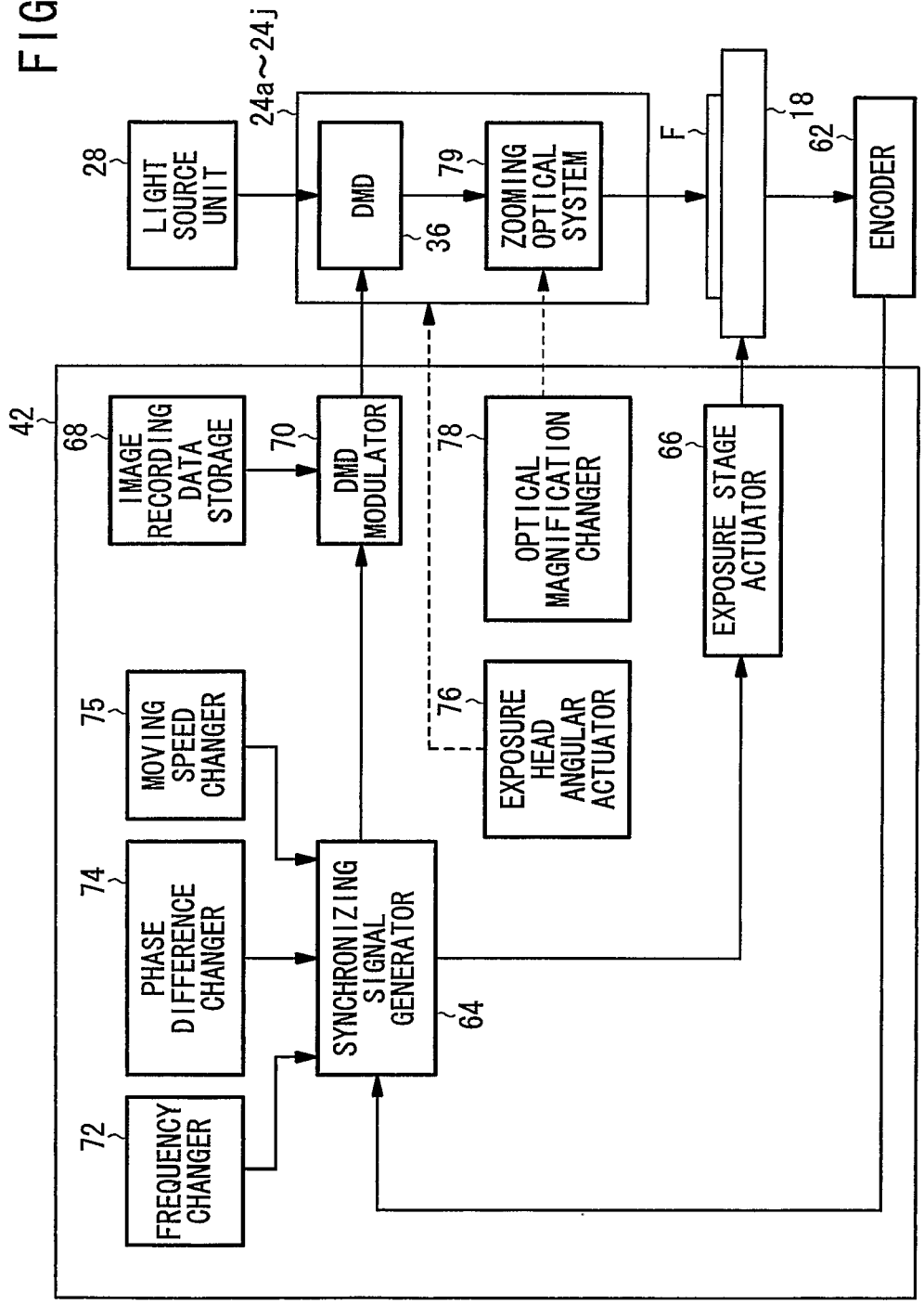
FIG. 8 is a block diagram of a control circuit of the exposure apparatus according to the embodiment.

FIG. 8 shows in block form a control circuit of the exposure apparatus 10. The control unit 42 (control means) for controlling the exposure apparatus 10 has a synchronizing signal generator 64 for generating a synchronizing signal based on positional data of the exposure stage 18 detected by an encoder 62, an exposure stage actuator 66 for moving the exposure stage 18 in the scanning direction based on the generated synchronizing signal, an image recording data storage 68 for storing image recording data of an image to be recorded on the sheet film F, and a DMD modulator 70 for modulating the SRAM cell 38 of the DMD 36 based on the synchronizing signal and the image recording data and actuating the micromirrors 40.

The control unit 42 also has a frequency changer 72 (image recording frequency changing means) for changing the synchronizing signal generated by the synchronizing signal generator 64, a phase difference changer 74 (modulation timing changing means), and a moving speed changer 75 (moving speed changing means).

The frequency changer 72 changes the image recording frequency for determining the timing of on/off control in the scanning direction of the micromirrors 40 of the DMD 36 and supplies the changed image recording frequency to the synchronizing signal generator 64, thereby adjusting the image recording pitch in the scanning direction between image recording dots formed on the sheet film F. The phase difference changer 74 changes the modulation timing of on/off control of each of the micromirrors 40 or each of the regions that are obtained by dividing the DMD 36 properly and supplies the changed modulation timing to the synchronizing signal generator 64, thereby adjusting the phase differences in the scanning direction between image recording dots formed on the sheet film F. The moving speed changer 75 changes the moving speed of the exposure stage 18 and supplies the changed moving speed to the synchronizing signal generator 64, thereby adjusting the moving speed of the exposure stage 18.

The control unit 42 may have, if necessary, an exposure head angular actuator 76 (image recording element dot rotating means) and an optical magnification changer 78 (magnification changing means). The exposure head angular actuator 76 rotates the exposure heads 24a through 24j through a predetermined angle about the optical axis of the laser beam L, thereby adjusting the angle of the array pattern of image recording dots formed on the sheet film F with respect to the scanning direction. The angle of the array pattern of the image recording dots may alternatively be adjusted by rotating some optical members of the exposure heads 24a through 24j. The optical magnification changer 78 controls a zooming optical system 79, which is made up of the second image focusing optical lenses 50, 52 of the exposure heads 24a through 24j, to change the optical magnification, thereby adjusting the pitch of mirroring images (image recording element dots) formed on the sheet film F by the micromirrors 40.

The exposure apparatus 10 according to the embodiment is basically constructed as described above. Operation of the exposure apparatus 10 will be described below.

After the board with the sheet film F applied thereto is attracted to and held by the exposure stage 18, the control unit 42 operates the exposure stage actuator 66 to move the exposure stage 18 in one direction along the guide rails 16 on the base 14. When the exposure stage 18 moves between the posts of the column 20, the cameras 22a, 22b read the alignment mark formed in a given position on the board. Based on the positional data of the read alignment mark, the control unit 42 calculates position correcting data of the sheet film F.

After having calculated the position correcting data, the control unit 42 moves the exposure stage 18 in the opposite direction, and controls the scanner 26 to start recording an image on the sheet film F by way of exposure.

Specifically, the laser beam L emitted from the light source unit 28 is introduced through the optical fiber 30 into the exposure heads 24a through 24j. The introduced laser beam L travels through the rod lens 32 and is applied from the reflecting mirror 34 to the DMD 36.

Image recording data read from the image recording data storage 68 and corrected by the position correcting data is modulated by the DMD modulator 70 at timing according to the synchronizing signal supplied from the synchronizing signal generator 64. The modulated image recording data is supplied to the DMD 36. As a result, the micromirrors 40 of the DMD 36 are turned on and off by the image recording data at the timing according to the synchronizing signal.

The laser beam L that is selectively reflected in a desired direction by each of the micromirrors 40 of the DMD 36, as shown in FIGS. 4 and 5, is magnified by the first image focusing optical lenses 44, 46, adjusted to a predetermined diameter by the microaperture array 54, the microlens array 48, and the microaperture array 56, then adjusted to a predetermined magnification by the second image focusing optical lenses 50, 52 of the optical magnification changer 78, and led to the sheet film F.

The exposure stage 18 moves along the base 14, during which time a desired two-dimensional image is recorded on the sheet film F by the exposure heads 24a through 24j that are arrayed in the direction perpendicular to the moving direction of the exposure stage 18.

The two-dimensional image thus recorded on the sheet film F comprises a cluster of many discrete image recording dots (address grid dots) based on the micromirrors 40 of the DMD 36. Since the original image to be recorded is reproduced by being mapped onto discrete image recording dots on the sheet film F, drawbacks are produced in that the reproduced image contains jaggies because of the relationship between the original image and the array pattern of the image recording dots, or the accuracy of the linewidth of the original image is lowered.

According to the present invention, the array pattern of the image recording dots on the sheet film F is optimized to suppress the generation of jaggies to make it possible to record an appropriate image. A process of optimizing the array pattern of the image recording dots will be described below.

Figure 9:
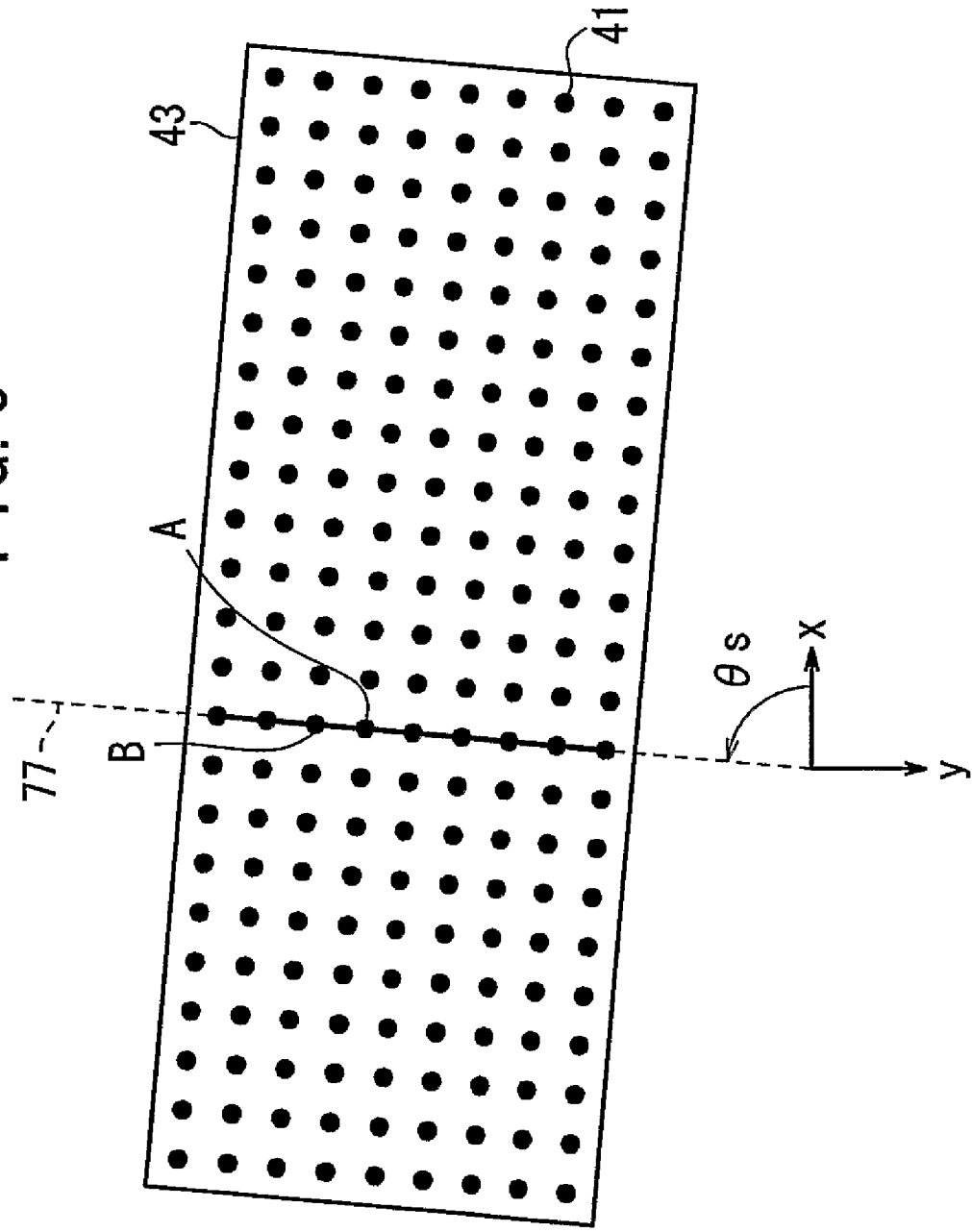
FIG. 9 is a view showing the image recording element dot group formed by the micromirrors of the DMD employed in the exposure head of the exposure apparatus according to the embodiment.

FIG. 9 shows a mirroring image group 43 (image recording element dot group) which is made up of mirroring images 41 (image recording element dots) on the sheet film F by the micromirrors 40 (image recording components, see FIG. 3) of one DMD 36. In FIG. 9, it is assumed that the scanning direction of the sheet film F is represented by y and the direction perpendicular to the scanning direction y by x, and a row of the mirroring images 41 arrayed substantially along the scanning direction y is defined as a swath 77. The swath 77 is held a predetermined angle θs (hereinafter referred to as "swath tilt angle θs" (≠90°)) with respect to the direction x in order to increase the resolution of the recorded image with respect to the direction x. Two adjacent mirroring images 41 on the swath 77 are referred to as mirroring images A, B.

Figure 10:
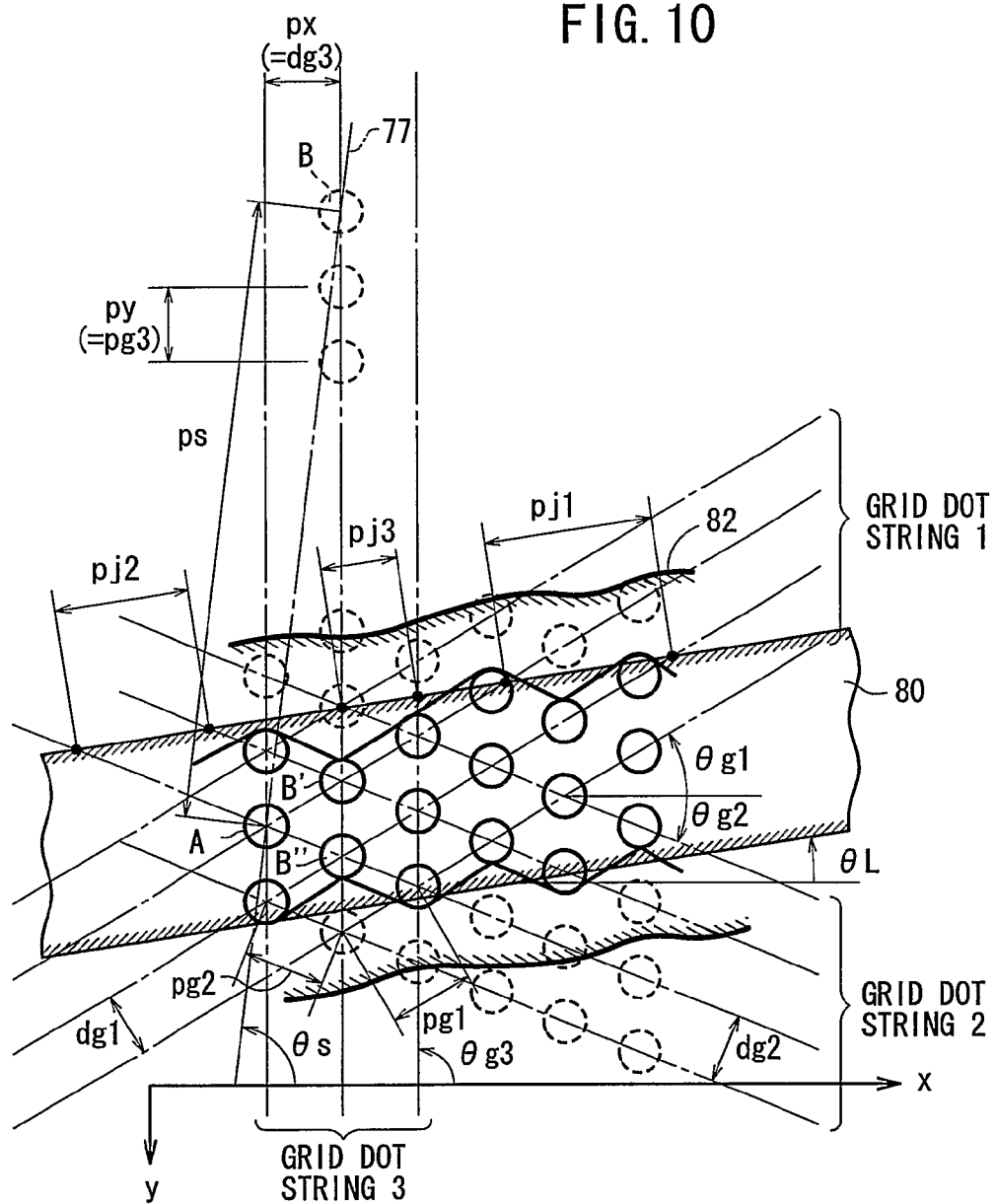
FIG. 10 is a diagram showing parameters of an image, the image recording element dots and image recording dots formed by the exposure head of the exposure apparatus according to the embodiment.

FIG. 10 schematically shows the relationship between address grid dots (represented by solid-line and dotted-like circles) which are image recording dots that can be recorded on the sheet film F by the DMD 36 with the mirroring images 41 arranged as shown in FIG. 9, and a straight original image 80 to be recorded. The original image 80 is reproduced by a plurality of address grid dots represented by the solid-line circles.

The laser beam L forms an image recording dot having a predetermined beam diameter (dot diameter) about each address grid dot. An image that is actually formed on the sheet film F includes but is not limited to an image that is wider than the profile of address grid dots indicated by the solid lines, as indicated by contour lines 82, for example. In FIG. 10, the mirroring images A, B are circles, but not limited to such circles. Practically, the mirroring images A, B may be deformed in the direction y by scanning. Even in such a case, jaggies will be produced similarly to FIG. 10.

As shown in FIG. 10, the address grid dots are arrayed in three types, i.e., grid dot strings 1 through 3. Each of the grid dot strings 1 through 3 is characterized by parameters including a tilt angle $\theta gi$ (i=1 through 3) of the grid dot strings 1 through 3 with respect to the direction x, a grid dot pitch pgi (i=1 through 3) of the grid dots making up each of the grid dot strings 1 through 3, and a string interval dgi (i=1 through 3) of the grid dot strings 1 through 3.

These parameters are determined by the array pitch ps of image recording element dots formed on the sheet film F by the adjacent mirroring images A, B (see FIG. 9) on the swath 77, the swath tilt angle θs (which is positive if counterclockwise from the direction x), and the image recording pitch py of the address grid dots in the direction y. The relationship between these parameters will be described below.

Figure 11:
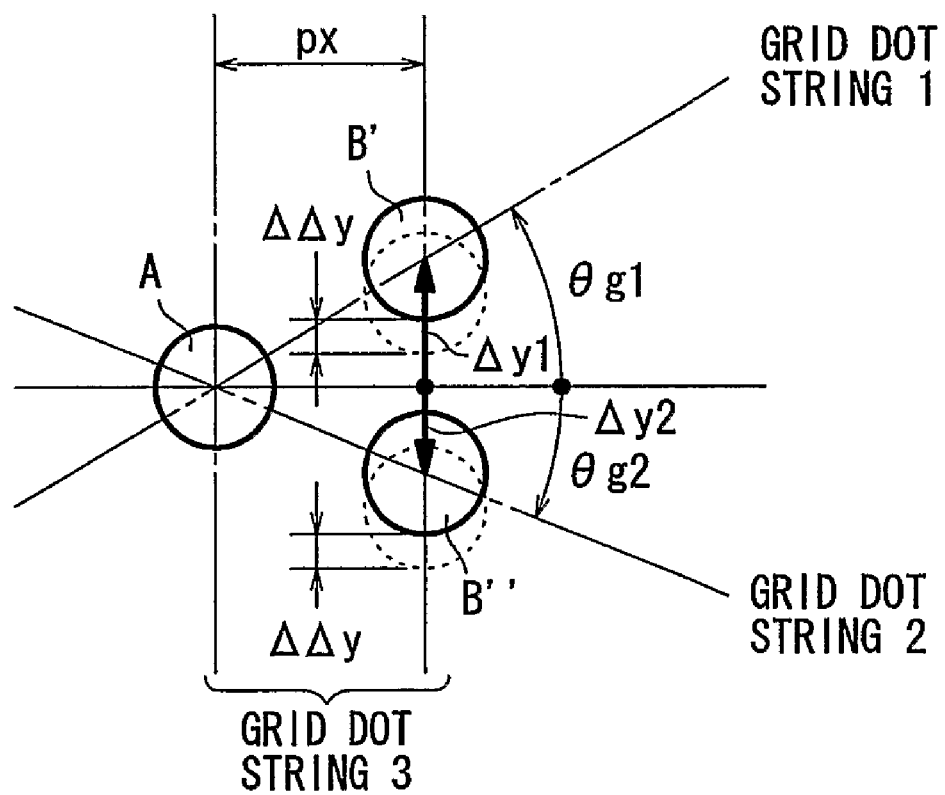
FIG. 11 is a diagram showing the parameters of the image recording dots formed by the exposure head of the exposure apparatus according to the embodiment.

(a) The tilt angle $\theta gi$ (i=1 through 3):

Three adjacent address grid dots A, B', B" shown in FIG. 11 will be considered. The tilt angle $\theta g3$ of the grid dot string 3 is given by:

$$\theta g3 = 90° \quad (1)$$

The tilt angles $\theta g1$, $\theta g2$ of the grid dot strings 1, 2 are expressed as follows:

If $N1 = \text{integer}(ps \cdot \sin \theta s / py)$ (integer represents rounding off)

$$N2 = N1 + 1,$$

then the shift amounts $\Delta y1$, $\Delta y2$ in the direction y of the address grid dots B', B" to the address grid dot A are given by:

$$\Delta yi = ps \cdot \sin \theta s - py \cdot N1 \quad (i=1, 2)$$

Since the image recording pitch px in the direction x between the address grid dots A, B', B" is represented by:

$$px = ps \cdot \cos \theta s$$

the following equation is satisfied:

$$\tan \theta gi = \Delta yi / py \quad (i=1, 2) \quad (2)$$

Therefore, the tilt angles $\theta g1$, $\theta g2$ of the grid dot strings 1 through 3 are determined as follows:

$$\theta gi = \tan^{-1}\{ps \cdot \sin \theta s - py \cdot Ni\}/(ps \cdot \cos \theta s)\}(i=1, 2) \quad (3)$$

(b) The grid dot pitch pgi (i=1 through 3):

Since the grid dot string 3 is made up of address grid dots arrayed in the direction y, the grid dot pitch pg3 thereof is given as $$pg3 = py \quad (4)$$

Furthermore, $$pgi = px/\cos \theta gi (i=1, 2) \quad (5)$$

(c) The string interval dgi (i=1 through 3):

The string interval dp3 of the grid dot string 3 is given as $$dp3 = px \quad (6)$$

$$dgi = py \cdot \cos \theta gi \ (i=1, 2) \quad (7)$$

Inasmuch jaggies produced when the original image 80 is reproduced by address grid dots are caused by the grid dot strings 1 through 3, the jaggies can be defined using the parameters of the grid dot strings 1 through 3 which are determined above and the tilt angle θL of the original image 80 with respect to the direction x. The jaggies are represented by jaggy pitches pj1 through pj3 and jaggy amplitudes aj1 through aj3.

(d) Jaggy pitch pji (i=1 through 3):

The jaggy pitch pji is determined by the string interval dgi of the grid dot strings 1 through 3 and the difference ($\theta$gi–$\theta$L) between the tilt angle $\theta$gi of the grid dot strings 1 through 3 and the tilt angle $\theta$L of the original image 80. If it is assumed that the address grid dots are successively formed on each of the grid dot strings 1 through 3, then the jaggy pitch pji on the average is expressed by:

$$pji = dgi/\sin(\theta gi - \theta L) \ (i=1 \text{ through } 3) \quad (8)$$

Figure 12:
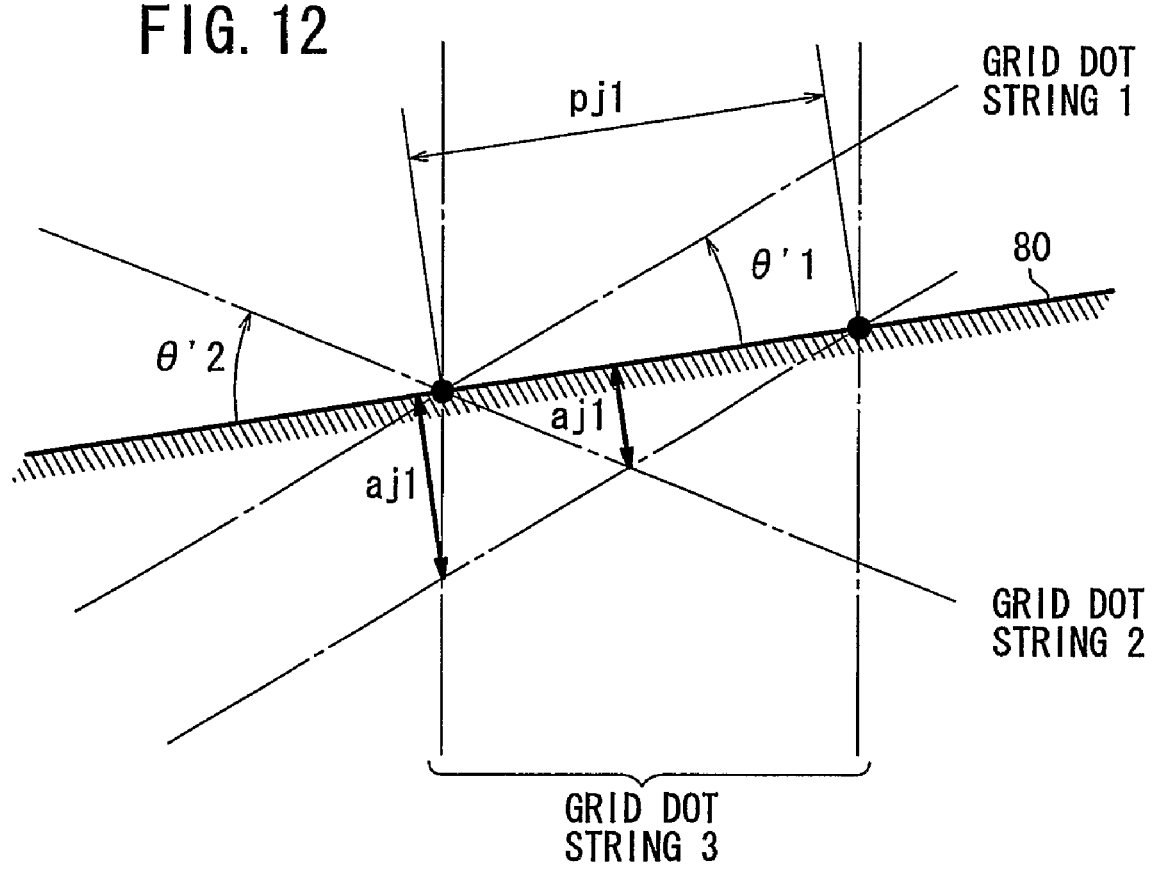
FIG. 12 is a diagram showing the parameters of the image formed by the exposure head of the exposure apparatus according to the embodiment.

(e) Jaggy amplitude aji (i=1 through 3):

FIG. 12 is illustrative of jaggies generated between the grid dot string 1 and the original image 80. The distance between intersections between the boundary of the original image 80 and the grid dot string 1 represents the jaggy pitch pj1. The jaggy amplitude aj1 is defined between the grid dot string 1 and the grid dot string 2 and also between the grid dot string 1 and the grid dot string 3. If a smaller one of these jaggy amplitudes aj1 is selected as a representative jaggy amplitude aj1, then, from the relationship shown in FIG. 12, $$aj1 = pj1 \cdot \tan\theta'1 \cdot \tan\theta'2 / (\tan\theta'2 - \tan\theta'1) \ (\theta'1 = \theta g1 - \theta L)$$

Therefore, the jaggy amplitude aji is expressed by:

$$aji = pji \cdot \tan\theta'i \cdot \tan\theta'k / (\tan\theta'k - \tan\theta'i)$$

$$(i=1 \text{ through } 3, \theta'i = \theta i - \theta L, k=1 \text{ through } 3, i \neq k) \quad (9)$$

$\theta$'k represents the angle formed between the grid dot string having the selected smaller jaggy amplitude aji and the original image 80.

Jaggies in the image reproduced on the sheet film F are visually perceived when both the jaggy pitch pji and the jaggy amplitude aji are large to some extent. Because each of the image recording dots making up the image is recorded with a certain diameter based on the beam diameter of the laser beam L around the address grid dots shown in FIG. 10, if the jaggy pitch pji is small, then no jaggies are visually perceived even if the jaggy amplitude aji is large. To make the jaggies less visually perceptible, therefore, the parameters may be selected so that either the jaggy pitch pji or the jaggy amplitude aji is of a predetermined value or less. The predetermine value may be represented by the beam diameter of the laser beam L.

The jaggy pitch pji and the jaggy amplitude aji are determined according to the equations (1) through (9) based on the parameters including the tilt angle $\theta$L of the original image 80 with respect to the direction x, the swath tilt angle $\theta$s, the array pitch ps of the adjacent mirroring images A, B on the swath 77, and the image recording pitch py of the address grid dots in the direction y. Consequently, an image with jaggies made less visually perceptible can be reproduced by individually adjusting these parameters or simultaneously adjusting two or more of these parameters.

The tilt angle $\theta$L is predetermined by the original image 80 to be recorded on the sheet film F. The swath tilt angle $\theta$s is determined by the tilt angle of the DMDs 36 incorporated in the exposure heads 24a through 24j with respect to the scanning direction and by the settings of each optical system of the exposure heads 24a through 24j shown in FIG. 2. The swath tilt angle $\theta$s can be adjusted by rotating the exposure heads 24a through 24j through a certain angle about the optical axis with the exposure head angular actuator 76. The swath tilt angle $\theta$s may also be adjusted by rotating some optical members of the exposure heads 24a through 24j, e.g., the microlens array 48 and the microaperture arrays 54, 56, or rotating an image rotating element such as a double prism or the like that is provided for rotating an optical image. The image rotating element may be disposed behind the second image focusing optical lenses 50, 52. If the second image focusing optical lenses 50, 52 are dispensed with and the laser beam L is focused directly onto the sheet film F by the microlens array 48, then the image rotating element may be disposed behind the microlens array 48.

The array pitch ps depends upon the spaced interval of the micromirrors 40 of the DMD 36. The array pitch ps on the sheet film F can be adjusted by changing the position of the second image focusing optical lenses 50, 52 of the zooming optical system 79 with the optical magnification changer 78. The image recording pitch py can be adjusted by adjusting the output timing of the synchronizing signal generated by the synchronizing signal generator 64 with a frequency changing signal from the frequency changer 72 or by supplying a moving speed changing signal from the moving speed changer 75 to the synchronizing signal generator 64 to change the output timing of the stage actuating synchronizing signal, thereby changing the moving speed in the direction y of the exposure stage 18 with the exposure stage actuator 66.

With respect to the original image 80 whose tilt angle $\theta$L changes depending on the position in the direction y, it is difficult to quickly change the swath tilt angle $\theta$s depending on the tilt angle $\theta$L of the original image 80. Therefore, it is reasonable to change the image recording pitch py with the frequency changer 72, for example.

In FIG. 10, for example, the jaggy pitch pji and the jaggy amplitude aji may be adjusted by shifting the recording timing of the mirroring image B with respect to the mirroring image A by a predetermined time with the phase difference changer 74, rather than simultaneously recording the mirroring images A, B. Thus, the shift amount $\Delta$yi of the mirroring images B', B", which is supposed to be formed adjacent to the mirroring image A in the direction x when the recording timing is the same, may be changed by the phase difference $\Delta\Delta$y in the direction y as shown in dotted lines in FIG. 11, resulting in a change in the tilt angle $\theta$gi.

FIGS. 13 through 15 and 16 through 18 show jaggy pitches pji and jaggy amplitudes aji of the grid dot strings 1 through 3 that are calculated according to the equations (8) and (9) with setting the parameters to be predetermined values. The absolute value of a smaller one of the baggy amplitudes produced between the grid dot strings is selected. The allowable range of jaggy pitches pji is represented by –5 μm to +5 μm, and the allowable range of jaggy amplitudes aji by –1 μm to +1 μm.

Figure 13:
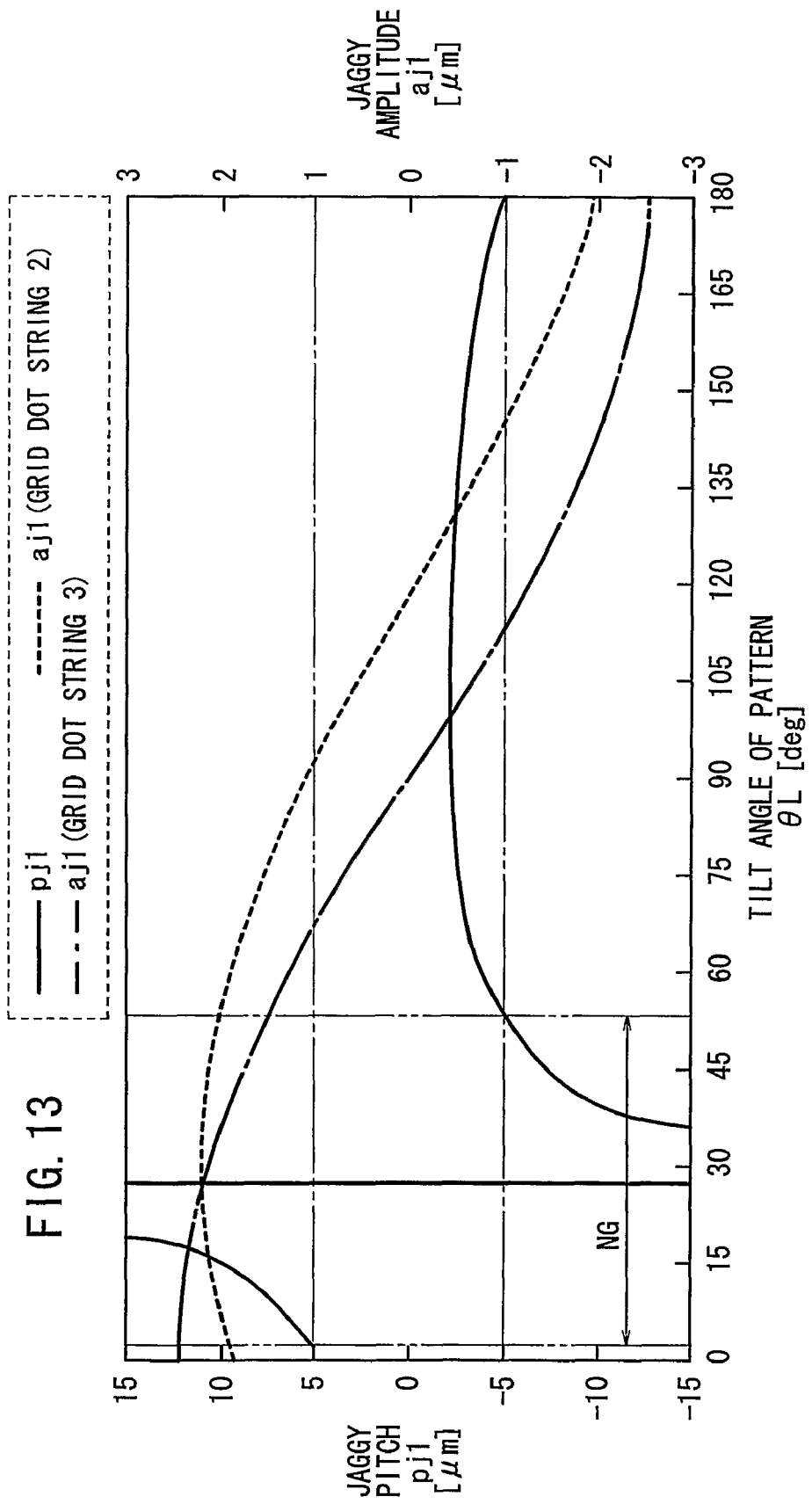
FIG. 13 is a diagram showing calculated jaggy pitches and jaggy amplitudes of the image formed by the exposure head of the exposure apparatus according to the embodiment.
Figure 14:
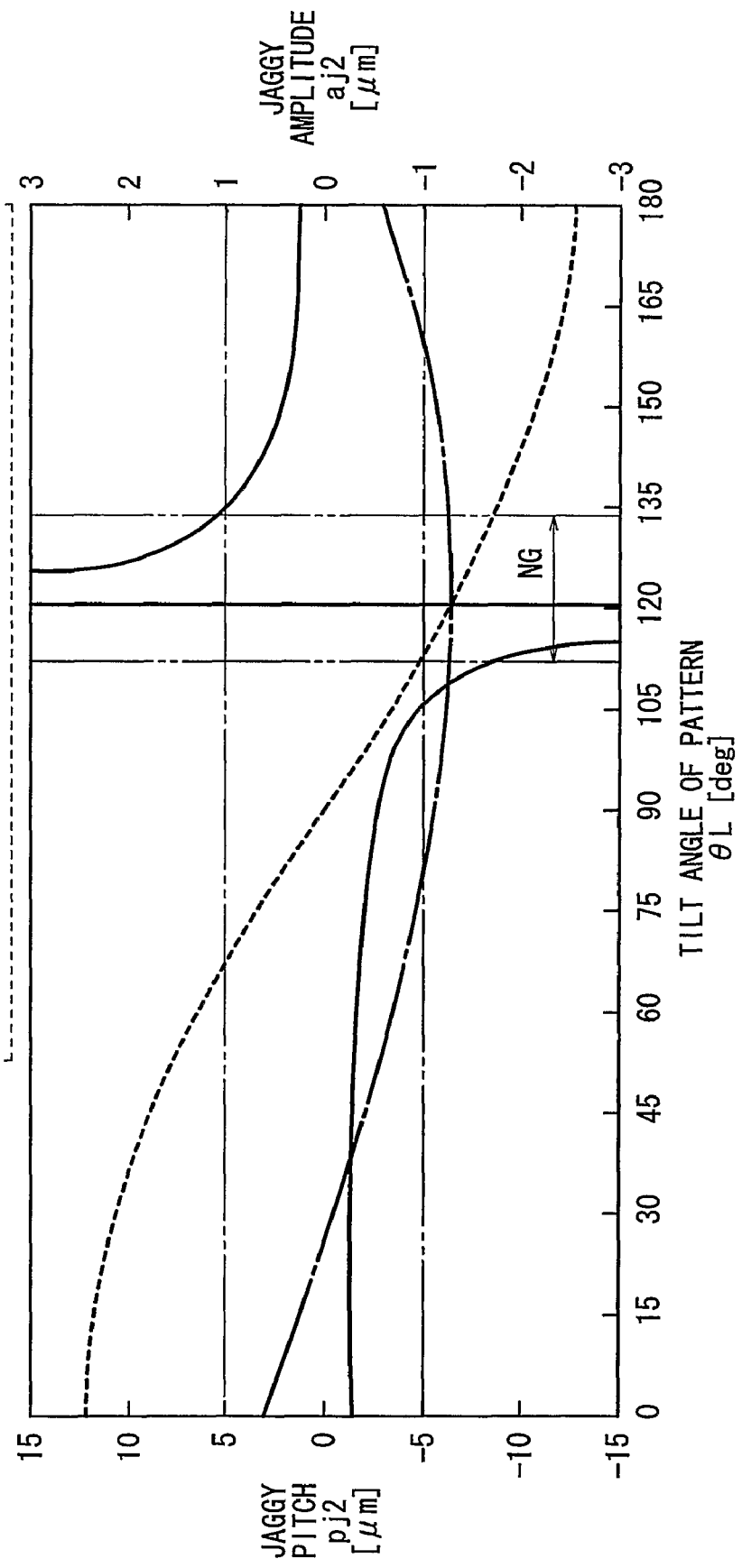
FIG. 14 is a diagram showing calculated jaggy pitches and jaggy amplitudes of the image formed by the exposure head of the exposure apparatus according to the embodiment.
Figure 15:
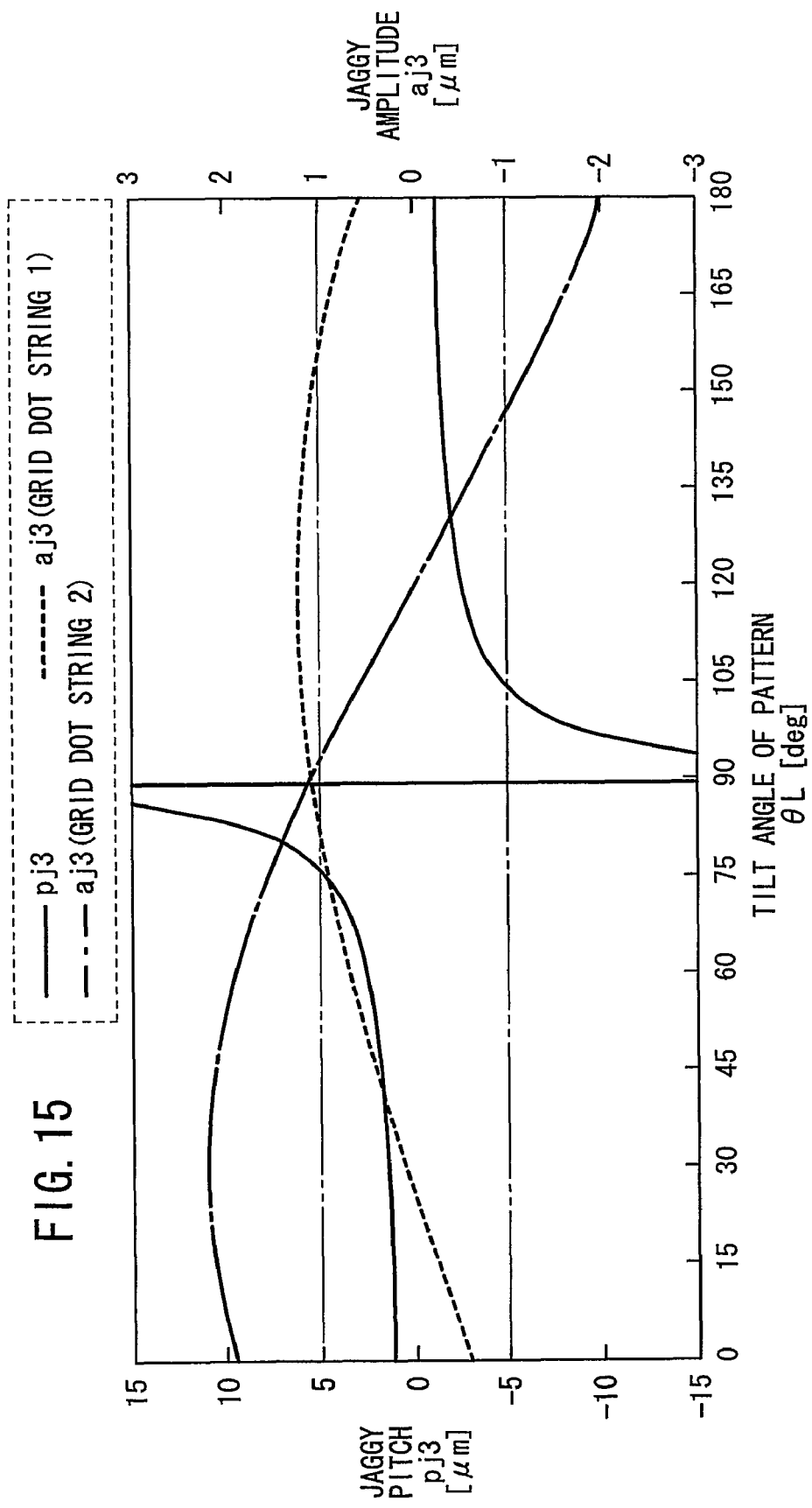
FIG. 15 is a diagram showing calculated jaggy pitches and jaggy amplitudes of the image formed by the exposure head of the exposure apparatus according to the embodiment.

With respect to the grid dot string 1 shown in FIG. 13, it is predicted that unallowable jaggles are produced when the tilt angle $\theta$L of the original image 80 is in the range of $\theta$L=0° to 55°. With respect to the grid dot string 2 shown in FIG. 14, it is predicted that unallowable jaggies are produced when the tilt angle $\theta$L of the original image 80 is in the range of $\theta$L=110° to 135°. With respect to the grid dot string 3 shown in FIG. 15, it is predicted that unallowable jaggies are not produced. If the original image 80 is a straight line having a tilt angle of about 0°, for example, then the straight line tends to suffer unallowable jaggies due to the grid dot string 1.

Figure 16:
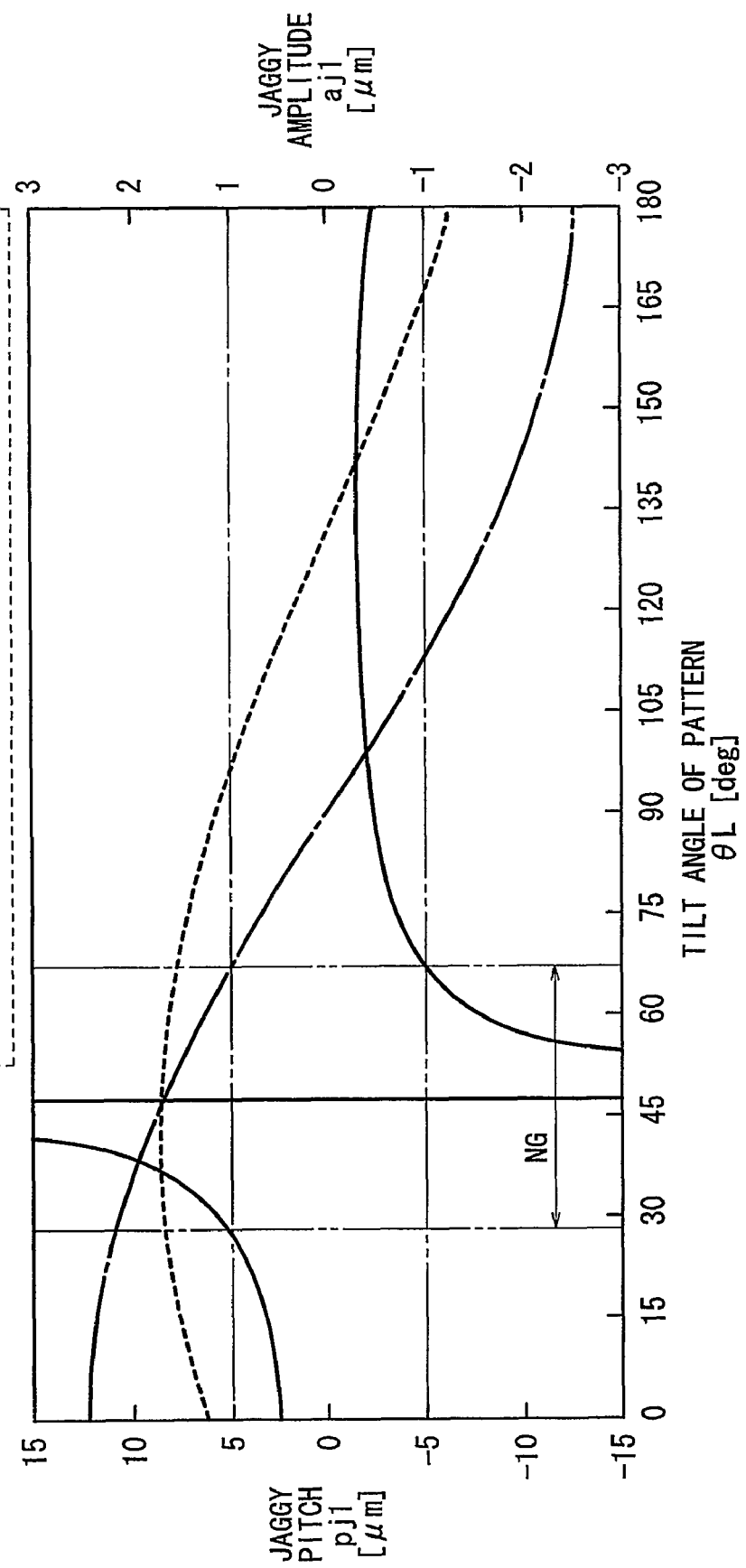
FIG. 16 is a diagram showing calculated jaggy pitches and jaggy amplitudes of the image formed by the exposure head of the exposure apparatus according to the embodiment.
Figure 17:
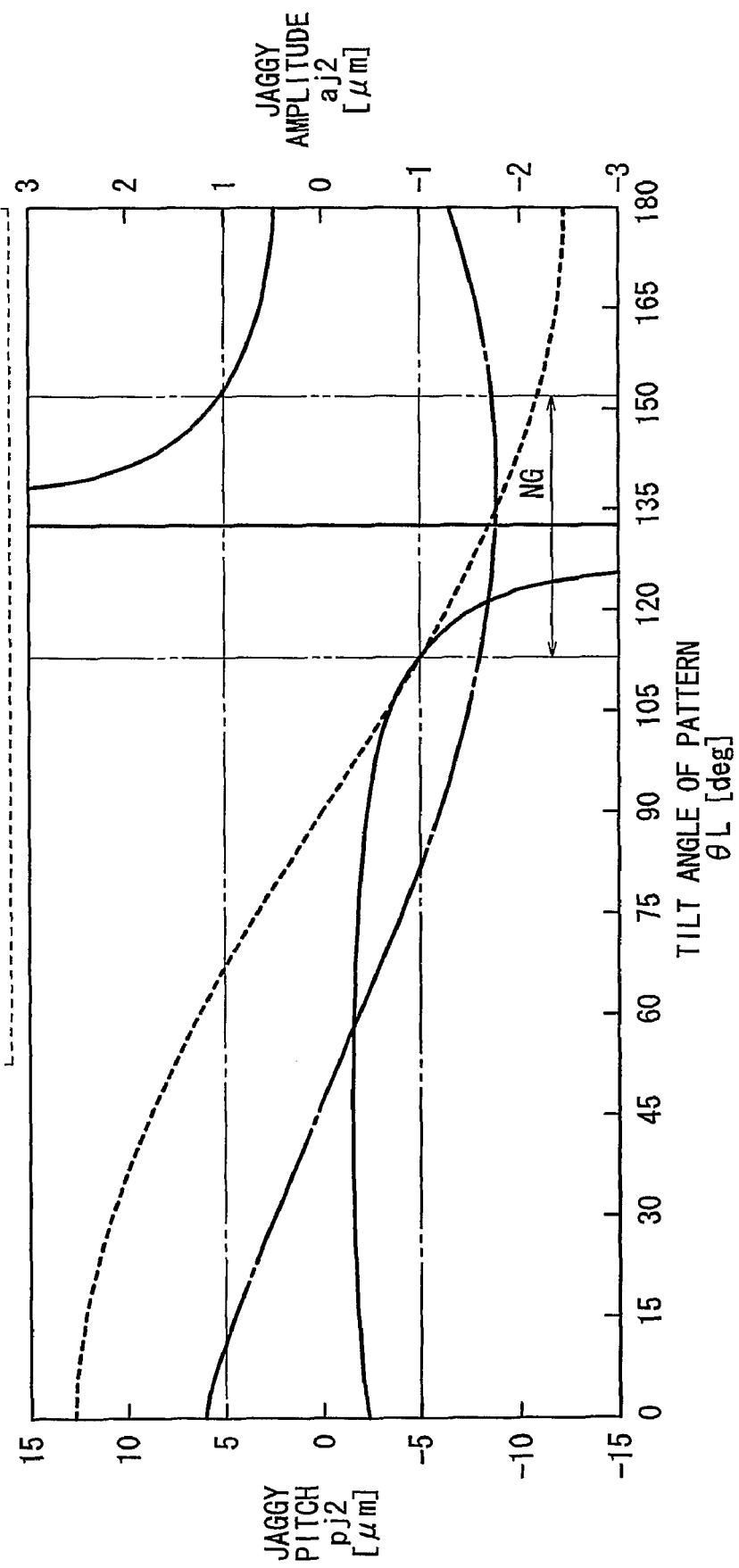
FIG. 17 is a diagram showing calculated jaggy pitches and jaggy amplitudes of the image formed by the exposure head of the exposure apparatus according to the embodiment.
Figure 18:
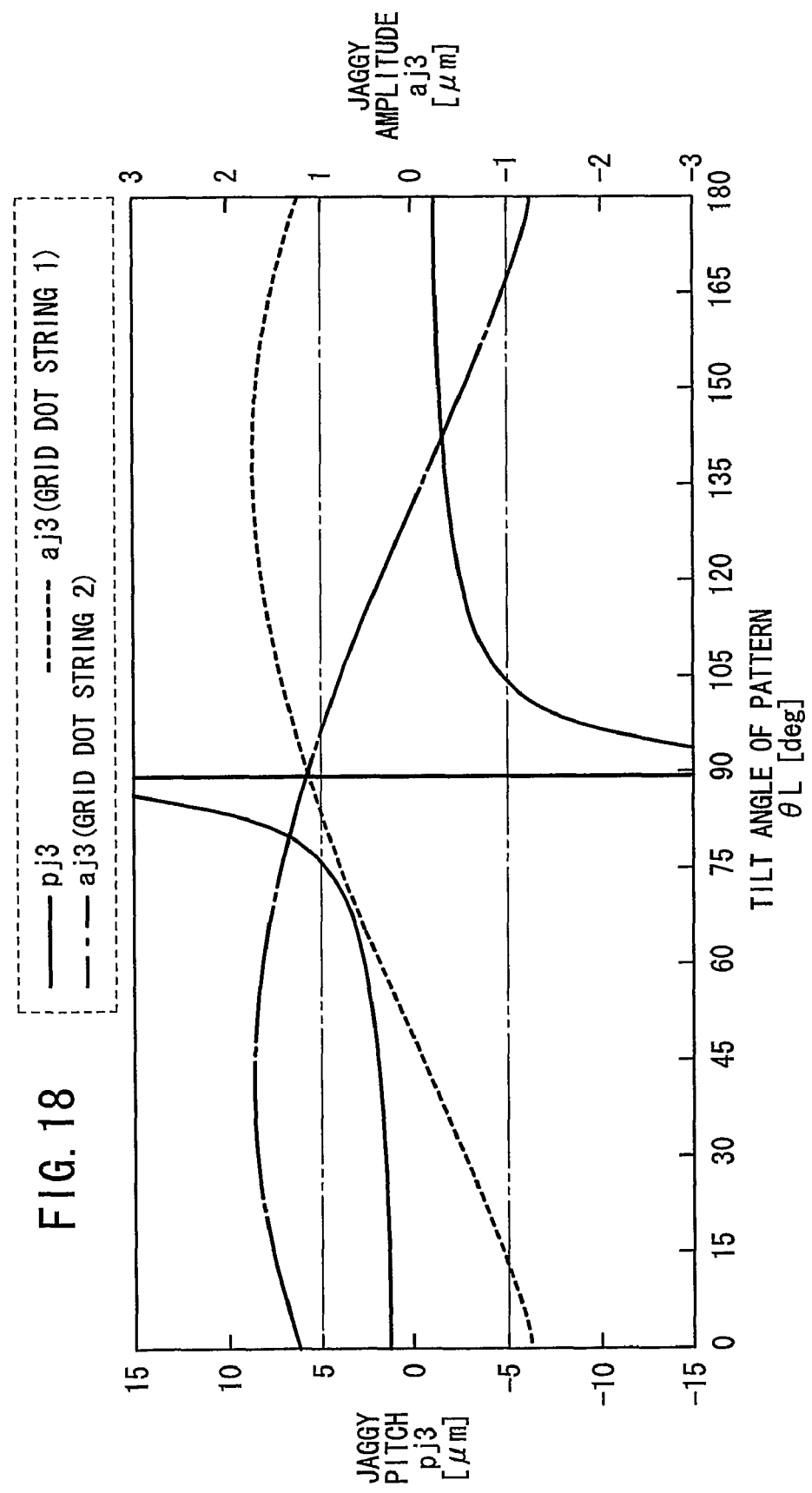
FIG. 18 is a diagram showing calculated jaggy pitches and jaggy amplitudes of the image formed by the exposure head of the exposure apparatus according to the embodiment.

With respect to the grid dot strings 1 through 3 with changed parameters shown in FIGS. 16 through 18, it is expected that no jaggies are produced when the tilt angle $\theta$L of the original image 80 is about 0°, producing good images.

In the embodiment described above, the suppression of jaggies produced by one DMD 36 has been described. However, it is possible to apply the same adjustment process to each of the DMDs 36 of the exposure heads 24a through 24j. The parameters of the individual exposure heads 24a through 24j may be adjusted. However, in order to reduce the jaggies in the entire recorded image, the image recording pitch py, for example, may be adjusted by the moving speed of the exposure stage 18 so that the average of jaggy pitches or jaggy amplitudes of the jaggies produced by the exposure heads 24a through 24j is of a predetermined value or less.

Especially if the pattern of the original image 80 is a linear pattern extending in a direction close the direction x or the direction x where jaggies are more visible, the parameters should preferably be adjusted to minimize the jaggies of the linear pattern. Further, each of the parameters may be set or changed depending on a pattern of the original image 80, e.g., the tilt angle $\theta L$ of each original image 80 with respect to the direction x.

Alternatively, the correlation between the shape of jaggies which are defined by the jaggy pitch or the jaggy amplitude and each of the parameters for adjusting the jaggies may be determined, and optimum parameters may be set or changed based on the correlation to produce a suitable image with ease.

Further alternatively, conditions of the parameters for bringing the shape of jaggies into an allowable range may be determined as selecting conditions, and desired parameters depending on the original image 80 may be selected and set, or conditions of the parameters for bringing the shape of jaggies out of an allowable range may be determined as inhibiting conditions, and the selection of the parameters may be inhibited depending on the original image 80.

The correlation between the original image 80 and the parameters may be determined by selecting the direction of a pattern of the original image 80, e.g., the direction of a dominant pattern in a certain region of the original image 80, or the averaged direction, or the direction in which a histogram of directions is maximum. The image to be recorded may be divided into a plurality of regions, the above correlation may be determined in each of the regions, and parameters may be set for reducing jaggies for each of the regions.

Parameters for reducing jaggies may also be set by setting initial parameters, recording an image, measuring the correlation between the parameters and a jaggy shape etc., and searching for and setting optimum parameters.

In the above embodiment, the DMD 36 has the micromirrors 40 disposed on the grid of rows and columns that extend perpendicularly to each other. Alternatively, a DMD comprising micromirrors 40 disposed on a grid of rows and columns that extend at the tilt angle $\theta s$ with respect to each other can be employed.

A transmissive spatial light modulator such as LCD may be used instead of the DMD 36 which is a reflective spatial light modulator. Also, an MEMS (Micro Electro-Mechanical Systems) spatial light modulator, or a spatial light modulator other than the MEMS type, such as an optical device (PLZT device) for modulating transmitted light based on an electro-optical effect, or a liquid crystal shutter array such as a liquid crystal light shutter (FLC) or the like may be employed. The MEMS is a generic term representing microsystems made up of integrated microsize sensors, actuators, and control circuits fabricated by the micromachining technology based on the IC fabrication process. An MEMS spatial light modulator refers to a spatial light modulator that is actuated by electro-mechanical operation based on electrostatic or electromagnetic forces or the like. A two-dimensional assembly of grating light valves (GLV) may also be employed. As a light source, a lamp or the like, rather than a laser may be employed.

In the above embodiment, the semiconductor lasers are used as the light source. Alternatively, a solid-state laser, an ultraviolet LD, an infrared LD, or the like may also be used as the light source. Furthermore, a light source having a two-dimensional array of light-emitting dots (e.g., an LD array, an LED array, or the like) may also be employed instead of a spatial light modulator.

In the above embodiment, the exposure apparatus 10 is of a flat bed type. Alternatively, it may be an exposure apparatus of an outer drum type with a photosensitive medium wound around the outer circumferential surface of a drum or an exposure apparatus of an inner drum type with a photosensitive medium mounted on the inner circumferential surface of a drum.

The exposure apparatus 10 may appropriately be used to expose a dry film resist (DFR) in a process of manufacturing a printed wiring board (PWB), to form a color filter in a process of manufacturing a liquid crystal display (LCD), to expose a DFR in a process of manufacturing a TFT, and to expose a DFR in a process of manufacturing a plasma display panel (PDP), etc., for example. The present invention may be applied to a substrate coated with a photosensitive material.

The exposure apparatus 10 described above may use either a photon-mode photosensitive material on which information is directly recorded by light exposure or a heat-mode photosensitive material on which information is recorded with heat generated by exposure. If the photon-mode photosensitive material is employed, then a GaN semiconductor laser, a wavelength-conversion solid-state laser, or the like is used as the laser beam source. If the heat-mode photosensitive material is employed, then an infrared semiconductor laser, a solid-state laser, or the like is used as the laser beam source.

The arrangement of the present invention is not limited to the exposure apparatus, but may be applied to ink jet recording heads, for example. Specifically, ink jet recording heads generally have nozzles on a nozzle surface facing a recording medium (e.g., a recording sheet, an OHP sheet, or the like), for ejecting ink droplets. Some ink jet recording heads have a plurality of nozzles disposed in a grid pattern, and are tilted with respect to the scanning direction to record images of high resolution. In such ink jet recording heads with a two-dimensional array of nozzles, the parameters of the nozzles of the ink jet recording heads may be adjusted to prevent jaggies from being produced in images.

The invention claimed is:

1. An image recording apparatus for recording an image based on image recording data, said image recording apparatus including image recording heads relatively movable in a predetermined scanning direction along an image recording surface, said apparatus comprising:

an image recording component group comprising a two-dimensional array of a plurality of image recording components, for forming a two-dimensional image recording dot group by a plurality of image recording element dots inclined at a predetermined tilt angle to said predetermined scanning direction on said image recording surface; and control means for modulating each of said image recording components at predetermined timing according to said image recording data;

wherein an array pitch between adjacent ones of said image recording element dots, said tilt angle, an image recording pitch between image recording dots formed in said scanning direction, or a phase difference between image recording positions in said scanning direction of adjacent ones of said image recording element dots is set so that a jaggy pitch or a jaggy amplitude of jaggies produced because of the relationship between the array pattern of said image recording dots formed on said image recording surface and an image pattern based on said image recording data is of a predetermined value or less.

2. An image recording apparatus according to claim 1, wherein said image recording component group comprises a spatial light modulator for modulating illuminating light applied thereto with said image recording data and leading the modulated illuminating light to said image recording surface.

3. An image recording apparatus according to claim 2, wherein said spatial light modulator comprises a micromirror device having a two-dimensional array of many micromirrors having reflecting surfaces for reflecting said illuminating light, said reflecting surfaces having an angle variable according to said image recording data.

4. An image recording apparatus according to claim 1, further comprising image recording element dot rotating means for rotating all or some of said image recording heads to change said tilt angle of said image recording element dots.

5. An image recording apparatus according to claim 1, further comprising magnification changing means for changing said array pitch by changing an image recording magnification of said image recording element dots formed on said image recording surface.

6. An image recording apparatus according to claim 1, comprising image recording frequency changing means for changing a frequency at which the image recording dots are recorded by said image recording components thereby to change said image recording pitch.

7. An image recording apparatus according to claim 1, comprising moving speed changing means for changing a relative moving speed of said image recording heads with respect to said image recording surface thereby to change said image recording pitch.

8. An image recording apparatus according to claim 1, comprising modulation timing changing means for changing timing at which the image recording components adjacent to each other in the scanning direction are modulated thereby to change said phase difference.

9. An image recording apparatus according to claim 1, wherein said predetermined value of said jaggy pitch is set to a dot diameter or less of said image recording dots formed on said image recording surface.

10. An image recording apparatus according to claim 1, including a plurality of said image recording heads, wherein said array pitch, said tilt angle, said image recording pitch, or said phase difference is individually set in each of said image recording heads.

11. An image recording apparatus according to claim 1, including a plurality of said image recording heads, wherein said array pitch, said tilt angle, said image recording pitch, or said phase difference is set so that the average of jaggy pitches or jaggy amplitudes produced in each of said image recording heads is of the predetermined value or less.

12. An image recording apparatus according to claim 1, wherein said array pitch, said tilt angle, said image recording pitch, or said phase difference is set depending on the tilt angle of said image pattern with respect to said scanning direction.

13. An image recording apparatus according to claim 1, wherein said array pitch, said tilt angle, said image recording pitch, or said phase difference is set so that said jaggy pitch or said jaggy amplitude produced by said image pattern in a direction perpendicular or substantially perpendicular to said scanning direction is of the predetermined value or less.

14. An image recording method of forming a two-dimensional image recording dot group with a plurality of image recording element dots inclined at a predetermined angle with respect to a predetermined scanning direction along an image recording surface by moving image recording heads relatively in said predetermined scanning direction along said image recording surface and modulating each of said image recording components at predetermined timing based on image recording data, said moving image recording heads each comprising a two-dimensional array of said image recording components, comprising the step of:
setting an array pitch between said image recording element dots adjacent to each other, said tilt angle, an image recording pitch between image recording dots formed in said scanning direction, or a phase difference between image recording positions in said scanning direction of said image recording element dots adjacent to each other, so that a jaggy pitch or a jaggy amplitude of jaggies produced because of the relationship between the array pattern of said image recording dots formed on said image recording surface and an image pattern based on said image recording data is of a predetermined value or less.

15. An image recording method according to claim 14, wherein said tilt angle is changed by rotating all or some of said image recording heads.

16. An image recording method according to claim 14, wherein said array pitch is changed by changing an image recording magnification of said image recording element dots formed on said image recording surface.

17. An image recording method according to claim 14, wherein said image recording pitch is changed by changing a frequency at which the image recording dots are recorded by said image recording components.

18. An image recording method according to claim 14, wherein said image recording pitch is changed by changing a relative moving speed of said image recording heads with respect to said image recording surface.

19. An image recording method according to claim 14, wherein said phase difference is changed by changing timing at which the adjacent image recording components are modulated.

20. An image recording method according to claim 14, wherein said predetermined value of said jaggy pitch is set to a dot diameter or less of said image recording dots formed on said image recording surface.

21. An image recording method according to claim 14, wherein a plurality of said image recording heads are provided, and said array pitch, said tilt angle, said image recording pitch, or said phase difference is individually set in each of said image recording heads.

22. An image recording method according to claim 14, wherein a plurality of said image recording heads are provided, and said array pitch, said tilt angle, said image recording pitch, or said phase difference is set so that the average of jaggy pitches or jaggy amplitudes produced in each of said image recording heads is of the predetermined value or less.

23. An image recording method according to claim 14, wherein said array pitch, said tilt angle, said image recording pitch, or said phase difference is set depending on the tilt angle of said image pattern with respect to said scanning direction.

24. An image recording method according to claim 14, wherein said array pitch, said tilt angle, said image recording pitch, or said phase difference is set so that said jaggy pitch or said jaggy amplitude produced by said image pattern in a direction perpendicular or substantially perpendicular to said scanning direction is of the predetermined value or less.

* * * * *